(12) United States Patent
Janik

(10) Patent No.: US 10,199,824 B2
(45) Date of Patent: Feb. 5, 2019

(54) INTER-ISLAND POWER TRANSMISSION SYSTEM AND METHOD

(71) Applicant: ELECTRONIC POWER DESIGN, INC., Houston, TX (US)

(72) Inventor: John Bradford Janik, Houston, TX (US)

(73) Assignee: Electronic Power Design, Inc., Houston, TX (US)

( * ) Notice: Subject to any disclaimer, the term of this patent is extended or adjusted under 35 U.S.C. 154(b) by 353 days.

(21) Appl. No.: 15/227,916

(22) Filed: Aug. 3, 2016

(65) Prior Publication Data
US 2017/0133846 A1    May 11, 2017

Related U.S. Application Data

(60) Provisional application No. 62/200,601, filed on Aug. 3, 2015.

(51) Int. Cl.
| | |
|---|---|
| H02J 3/02 | (2006.01) |
| G05B 15/02 | (2006.01) |
| H02M 5/42 | (2006.01) |
| H01F 38/14 | (2006.01) |
| G01R 15/20 | (2006.01) |
| G01R 31/40 | (2014.01) |
| H01F 27/24 | (2006.01) |
| H02J 3/06 | (2006.01) |
| H02J 13/00 | (2006.01) |
| H02J 3/00 | (2006.01) |

(52) U.S. Cl.
CPC ............ *H02J 3/02* (2013.01); *G01R 15/20* (2013.01); *G01R 31/40* (2013.01); *G05B 15/02* (2013.01); *H01F 27/24* (2013.01); *H01F 38/14* (2013.01); *H02J 3/06* (2013.01); *H02J 13/0075* (2013.01); *H02J 13/0096* (2013.01); *H02J 2003/001* (2013.01); *Y04S 10/525* (2013.01)

(58) Field of Classification Search
CPC .. H02J 3/02; H02M 5/42; H01F 38/14; H02H 9/021; G01R 15/207
See application file for complete search history.

(56) References Cited

U.S. PATENT DOCUMENTS

| | | | |
|---|---|---|---|
| 8,502,542 B2* | 8/2013 | Couture | G01R 31/085 324/500 |
| 2006/0187074 A1* | 8/2006 | O'Sullivan | G01R 15/142 340/660 |
| 2012/0200279 A1* | 8/2012 | Pamulaparthy | H02J 3/1807 323/301 |
| 2013/0110425 A1* | 5/2013 | Sharma | G01R 29/16 702/62 |
| 2015/0226772 A1* | 8/2015 | Kreikebaum | G01R 15/202 324/244 |

(Continued)

*Primary Examiner* — Changhyun Yi
(74) *Attorney, Agent, or Firm* — G. Michael Roebuck, PC

(57) ABSTRACT

In a particular illustrative embodiment of the present invention, an inter-island power transmission system is disclosed. An electronic box is placed on each end of a medium voltage three phase power cable running between two islands. The electronic box senses an open cable on the three phase cable and switches to direct current power transmission on the remaining two good cables. The direct current power is converted back to three phase power transmission on the receiving end of the direct current power.

12 Claims, 1 Drawing Sheet

(56) References Cited

U.S. PATENT DOCUMENTS

| | | | |
|---|---|---|---|
| 2016/0036231 A1* | 2/2016 | Ramsay | H02J 3/1828 |
| | | | 307/102 |
| 2016/0241336 A1* | 8/2016 | Kasztenny | H04B 10/0791 |
| 2017/0057369 A1* | 3/2017 | Nsje | B60L 11/1816 |
| 2017/0162320 A1* | 6/2017 | Rumrill | H01F 38/14 |
| 2018/0238955 A1* | 8/2018 | Bango | G01R 31/085 |

* cited by examiner

INTER-ISLAND POWER TRANSMISSION SYSTEM AND METHOD

FIELD OF THE INVENTION

The present invention relates to the field power transmission between islands at sea.

SUMMARY OF THE INVENTION

In a particular illustrative embodiment of the present invention, an inter-island power transmission system is disclosed. An electronic box is placed on each end of a medium voltage three phase power cable running between two islands. The electronic box senses an open cable on the three phase cable and switches to direct current power transmission on the remaining two good cables. The direct current power is converted back to three phase power transmission on the receiving end of the direct current power.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF AN ILLUSTRATIVE EMBODIMENT

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

Figure 1:
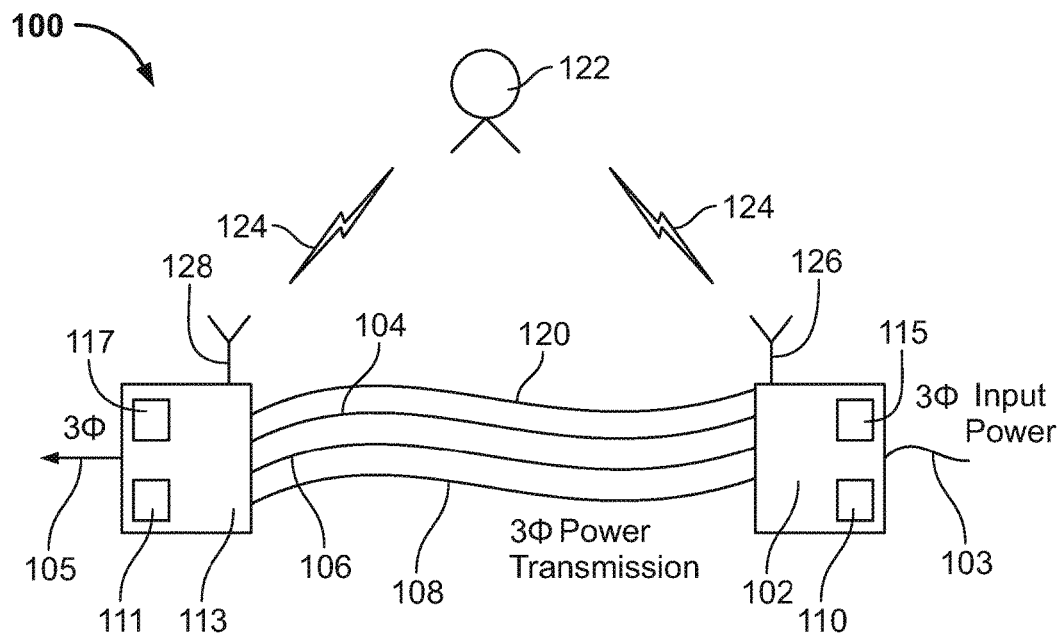
FIG. 1 is a schematic representation of an illustrative embodiment of the invention showing a three phase power line running between two islands.

Turning now to FIG. 1, FIG. 1 is schematic depiction of an illustrative embodiment of a system in accordance with the present invention. As shown in FIG. 1, in a particular illustrative embodiment three phase power 103 provided to a power transmission module 102. Power transmission module 102 includes but is not limited to a power transmission processor and non-transitory computer readable medium 110 and power sensors 115. The power transmission module 102 transmits the three phase power over cables 104, 106 and 108 to a power reception module 113. Power reception module 113 includes but is not limited to a processor and non-transitory computer readable medium 111. In a particular embodiment, a signal from an antennae 126 on 102 Power transmission module 102 sends and receives signals from antennae 128 on power reception module 113. The signal can be sent and received over one of the power transmission cables 104, 106 and 108 to a power reception module 113. The signal can be sent and received via satellite 122 to a power reception module 113. The signal can be sent and received over extra cable 120 to a power reception module 113. The signal can be sent via satellite 122. to a power reception module 113. The signal from power transmission module 102 contains data indicating power analysis and status of the power sent from power transmission module 102 cables 104, 106 and 108 to a power reception module 113.

Figure 2:
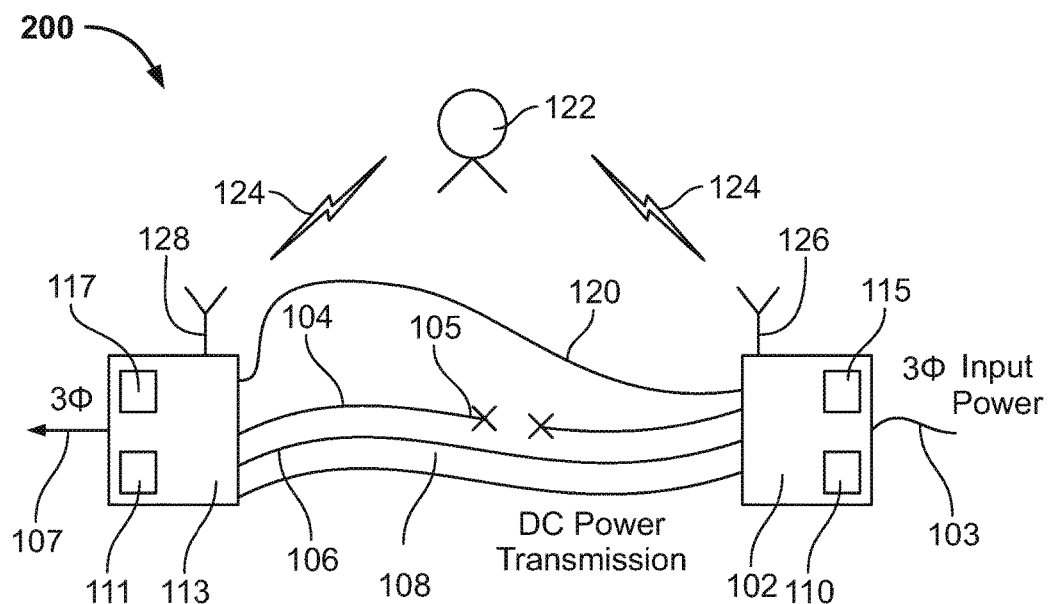
FIG. 2 is a schematic representation of an illustrative embodiment of the invention showing a three phase power line running between two islands.

Turning now to FIG. 2, as shown in FIG. 2 in a particular illustrative embodiment, power transmission module 102 senses a short circuit 105 on one 104 of the three phase cables and switches transmitting direct current (DC) power transmission on the two remaining three phase cables 106 and 108. The power reception module 113 senses the short circuit on cable 104 and converts the direct current power on cable 106 and 108 to three phase power 107. In an illustrative embodiment, when the power transmission module senses a short circuit on one of the three phase power cables 104, 106 and 108 the power transmission module switches to transmit DC power on the two remaining three phase power cables on which a short circuit was not sensed.

The sensors 115 sense the power supplied from power transmission module 102. The processor analyzes the power supplied from power transmission module 102 as sensed by the sensors 115 supplied from power transmission module 102. The power supplied from power transmission module 102 is analyzed for phase variations, amplitude variations and power factor variations. A power origination status report of the power for the power supplied from power transmission module 102 is stored in the computer readable medium. The status report indicates phase variations, amplitude variations and power factor variations. The status report is sent to the power reception module 113. The reception module receives the status report and compares the status report to an analysis performed by the processor 111 of the power sensed by sensors 117 of the power received from the power transmission module 102. The sensors 117 on power reception module 113 sense the power supplied from power transmission module 102. The processor 111 analyzes the power supplied from power transmission module 102 as sensed by the sensors 117. The power supplied from power transmission module 102 is analyzed for phase variations, amplitude variations and power factor variations. A power reception status report of the power received from power transmission module 102 at the power reception module is stored in the computer readable medium on the power reception module. The power reception status report indicates phase variations, amplitude variations and power factor variations. The power origination status report is compared to the power reception status report by the processor 111 and deviations between the phase variations, amplitude variations and power factor variations between the power origination status report and the power reception status report are reported back to the power transmission module are stored in the computer readable medium as a deviation status report. The deviation status report is sent from the power reception module to the power transmission module. The processor 110 adjusts the power sent from the power transmission module to substantially minimize deviations between the phase variations, amplitude variations and power factor variations between the power origination status report and the power reception status report are reported back to the power transmission module as reported in the deviation status report.

In a particular embodiment a system is disclosed for inter-island power transmission including but not limited to a three phase alternating current power cable set that sends power from the power transmission module 102 on a first island to power reception module 113 on a second island, wherein an open circuit on one of the three phase cables is sensed by the a power transmission processor and non-transitory computer readable medium 110 and power sensors 115 on the power transmission module 102 and the power from the first island is switched from three phase to provide direct current power transmission over the on the two remaining three phase power cables on which a short circuit was not sensed. The direct current power provided by the power transmission module is received and converted to three phase power at the power reception module 113.

In another particular embodiment, a method for inter-island power transmission is disclosed including but not limited to sensing an open circuit on one of the three phase cables on a power transmission processor and non-transitory computer readable medium 110 and power sensors 115 on the power transmission module 102 and switching the power from the first island from three phase to provide direct current power transmission over the on the two remaining three phase power cables on which a short circuit was not sensed. The method further includes but is not limited to receiving and converting the direct current power provided by the power transmission module to three phase power at the power reception module 113. The method further includes but is not limited to distributing the three phase power converted in the power reception module 113 to power users on the second island. the sensor measures the power supplied from power transmission module and the processor analyzes the power supplied from power transmission module as sensed by the sensor. The power supplied from power transmission module is analyzed for phase variations, amplitude variations and power factor variations and a power origination status report of the power for the power supplied from power transmission module is stored in the computer readable medium. In a particular embodiment, any presently well-known or future method and system of three phase power generation and analysis is suitable for use in sensing and analyzing the power supplied from power transmission module and the power received at the power reception module in the present invention.

In a particular illustrative embodiment a system for inter-island power transmission disclosed, the system including but not limited to a processor in data communication with a computer readable medium; a sensor in data communication with the computer readable medium and the processor; a set of three phase alternating current power cables in data communication with the sensor, wherein the sensor senses the power from a power transmission module on the processor in a first island, wherein an open circuit in one of the three phase power cables is sensed by sensor and the power from the power transmission module is switched from three phase to direct current power transmission and sent to a power reception module. In another embodiment of the system the direct current power received at the power reception module is converted to three phase power at the power reception module. In another embodiment of the system the sensor measures the power supplied from power transmission module and the processor analyzes the power supplied from power transmission module as sensed by the sensor. In another embodiment of the system the power supplied from power transmission module is analyzed for phase variations, amplitude variations and power factor variations and a power origination status report of the power supplied from power transmission module is stored in the computer readable medium. In another embodiment of the system the power origination status report indicates phase variations, amplitude variations and power factor variations. In another embodiment of the system the system further includes but is not limited to an antenna that sends the power origination status report to the power reception module. In another embodiment of the system a processor in the reception module receives the status report and compares the status report to an analysis performed by a processor on the power sensed by sensors of the power received from the power transmission module. In another embodiment of the system further includes but is not limited to sensors on the power reception module that sense the power supplied from power transmission module wherein the processor on the power reception module analyzes the power received from power transmission module as sensed by the sensors on the power transmission module and a power reception status report of the power received from power transmission module at the power reception module stored in the computer readable medium on the power reception module. In another embodiment of the system the power reception status report indicates phase variations, amplitude variations and power factor variations, wherein the power reception processor compares the power origination status report to the power reception status and deviations between the phase variations, amplitude variations and power factor variations between the power origination status report and the power reception status report are reported back to the power transmission module are stored in the computer readable medium as a deviation status report. In another embodiment of the system the deviation status report is sent from the power reception module to the power transmission module and the processor on the power transmission module adjusts the power sent from the power transmission module to substantially minimize deviations between the phase variations, amplitude variations and power factor variations between the power origination status report and the power reception status report are reported back to the power transmission module as reported in the deviation status report.

In another embodiment of the system a system for inter-island power transmission is disclosed including but not limited to a processor in data communication with a computer readable medium; a sensor in data communication with the computer readable medium and the processor; a set of three phase alternating current power cables in data communication with the sensor, wherein the sensor senses the power from a power transmission module on the processor in a first island, wherein the sensor measures the power supplied from power transmission module and the processor analyzes the power supplied from power transmission module as sensed by the sensor. In another embodiment of the system the power supplied from power transmission module is analyzed for phase variations, amplitude variations and power factor variations and a power origination status report of the power for the power supplied from power transmission module is stored in the computer readable medium and the power origination status report indicates phase variations, amplitude variations and power factor variations. In another embodiment of the system. In another embodiment of the system a processor in the reception module receives the status report and compares the status report to an analysis performed by a processor on the power sensed by sensors of the power received from the power transmission module, the system further comprising: sensors on the power reception module that sense the power supplied from power transmission module wherein the processor on the power reception module analyzes the power received from power transmission module as sensed by the sensors on the power transmission module and a power reception status report of the power received from power transmission module at the power reception module stored in the computer readable medium on the power reception module and the power reception status report indicates phase variations, amplitude variations and power factor variations, wherein the power reception processor compares the power origination status report to the power reception status and deviations between the phase variations, amplitude variations and power factor variations between the power origination status report and the power reception status report are reported back to the power transmission module are stored in the computer readable medium as a deviation status report, the deviation status report is sent from the power reception module to the power transmission module and the processor adjusts the power sent from the power transmission module to substantially minimize deviations between the phase variations, amplitude variations and power factor variations between the power origination status report and the power reception status report are reported back to the power transmission module as reported in the deviation status report and the deviation status report is sent from the power reception module to the power transmission module and the processor on the power transmission module adjusts the power sent from the power transmission module to substantially minimize deviations between the phase variations, amplitude variations and power factor variations between the power origination status report and the power reception status report are reported back to the power transmission module as reported in the deviation status report.

In another illustrative embodiment, a method for inter-island power transmission is disclosed, the method including but not limited to sensing a set of three phase alternating current power cables in data communication with the sensor, wherein the sensor senses the power from a power transmission module on the processor in a first island, wherein the sensor measures the power supplied from power transmission module and the processor analyzes the power supplied from power transmission module as sensed by the sensor. In another embodiment of the method the power supplied from power transmission module is analyzed for phase variations, amplitude variations and power factor variations and a power origination status report of the power for the power supplied from power transmission module is stored in the computer readable medium and the power origination status report indicates phase variations, amplitude variations and power factor variations. In another embodiment of the method, the method further includes but is not limited to comparing a status report to an analysis performed by a processor on the power sensed by sensors of the power received from the power transmission module, comparing a power origination status report to power reception status and deviations between the phase variations, amplitude variations and power factor variations between the power origination status report and the power reception status report; sending a deviation status report, from the power reception module to the power transmission module and adjusting in a power transmission processor, the power sent from the power transmission module to substantially minimize deviations between the phase variations, amplitude variations and power factor variations between the power origination status report and the power reception status report are reported back to the power transmission module as reported in the deviation status report and the deviation status report is sent from the power reception module to the power transmission module and the processor on the power transmission module adjusts the power sent from the power transmission module to substantially minimize deviations between the phase variations, amplitude variations and power factor variations between the power origination status report and the power reception status report are reported back to the power transmission module as reported in the deviation status report. In another embodiment of the system sensing an open circuit in one of a three phase alternating current power cable set that sends power from a sending electronic box on a first island to a receiving electronic box on a second island, wherein an open circuit on one of the three phase cables is sensed by the first electronic box; and switching the power from the first island from three phase power to direct current power transmission.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived there from, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are

The invention claimed is:

1. A system for inter-island power transmission comprising:
   a processor in data communication with a computer readable medium;
   a sensor in data communication with the computer readable medium and the processor;
   a set of three phase alternating current power cables in data communication with the sensor, wherein the sensor senses power from a power transmission module on the processor in a first island, wherein an open circuit in one of the three phase power cables is sensed by sensor and the power from the power transmission module is switched from three phase to direct current power transmission and sent to a power reception module;
   sensors on the power reception module that sense the power supplied from the power transmission module wherein the processor on the power reception module analyzes the power received from power transmission module as sensed by the sensors on the power transmission module and a power reception status report of the power received from power transmission module at the power reception module stored in the computer readable medium on the power reception module, wherein the power reception status report indicates phase variations, amplitude variations and power factor variations, wherein the power reception processor compares the power origination status report to the power reception status and deviations between the phase variations, amplitude variations and power factor variations between the power origination status report and the power reception status report are reported back to the power transmission module are stored in the computer readable medium as a deviation status report, wherein the deviation status report is sent from the power reception module to the power transmission module and the processor on the power transmission module adjusts the power sent from the power transmission module to substantially minimize deviations between the phase variations, amplitude variations and power factor variations between the power origination status report and the power reception status report are reported back to the power transmission module as reported in the deviation status report.

2. The system of claim 1, wherein the direct current power received at the power reception module is converted to three phase power at the power reception module.

3. The system of claim 1, wherein the sensor measures the power supplied from power transmission module and the processor analyzes the power supplied from power transmission module as sensed by the sensor.

4. The system of claim 3, wherein the power supplied from power transmission module is analyzed for phase variations, amplitude variations and power factor variations and a power origination status report of the power for the power supplied from power transmission module is stored in the computer readable medium.

5. The system of claim 4, wherein the power origination status report indicates phase variations, amplitude variations and power factor variations.

6. The system of claim 5, the system further comprising:
   an antenna that sends the power origination status report to the power reception module.

7. The system of claim 6, wherein a processor in the reception module receives the status report and compares the status report to an analysis performed by a processor on the power sensed by sensors of the power received from the power transmission module.

8. A system for inter-island power transmission comprising:
   a processor in data communication with a computer readable medium;
   a sensor in data communication with the computer readable medium and the processor;
   a set of three phase alternating current power cables in data communication with the sensor, wherein the sensor senses power from a power transmission module on the processor in a first island, wherein the sensor measures the power supplied from power transmission module and the processor analyzes the power supplied from power transmission module as sensed by the sensor,
   wherein a processor in the reception module receives the status report and compares the status report to an analysis performed by a processor on the power sensed by sensors of the power received from the power transmission module;
   sensors on the power reception module that sense the power supplied from power transmission module wherein the processor on the power reception module analyzes the power received from power transmission module as sensed by the sensors on the power transmission module and a power reception status report of the power received from power transmission module at the power reception module stored in the computer readable medium on the power reception module and the power reception status report indicates phase variations, amplitude variations and power factor variations, wherein the power reception processor compares the power origination status report to the power reception status and deviations between the phase variations, amplitude variations and power factor variations between the power origination status report and the power reception status report are reported back to the power transmission module are stored in the computer readable medium as a deviation status report, the deviation status report is sent from the power reception module to the power transmission module and the processor adjusts the power sent from the power transmission module to substantially minimize deviations between the phase variations, amplitude variations and power factor variations between the power origination status report and the power reception status report are reported back to the power transmission module as reported in the deviation status report and the deviation status report is sent from the power reception module to the power transmission module and the processor on the power transmission module adjusts the power sent from the power transmission module to substantially minimize deviations between the phase variations, amplitude variations and power factor variations between the power origination status report and the power reception status report are reported back to the power transmission module as reported in the deviation status report.

9. The system of claim 8 wherein the power supplied from power transmission module is analyzed for phase variations, amplitude variations and power factor variations and a power origination status report of the power for the power supplied from power transmission module is stored in the computer readable medium and the power origination status report indicates phase variations, amplitude variations and power factor variations.

10. A method for inter-island power transmission comprising:
sensing a set of three phase alternating current power cables in data communication with the sensor, wherein the sensor senses the power from a power transmission module on the processor in a first island, wherein the sensor measures the power supplied from power transmission module and the processor analyzes the power supplied from power transmission module as sensed by the sensor,
comparing a status report to an analysis performed by a processor on the power sensed by sensors of the power received from the power transmission module,
comparing a power origination status report to power reception status and deviations between the phase variations, amplitude variations and power factor variations between the power origination status report and the power reception status report;
sending a deviation status report, from the power reception module to the power transmission module;
and adjusting in a power transmission processor, the power sent from the power transmission module to substantially minimize deviations between the phase variations, amplitude variations and power factor variations between the power origination status report and the power reception status report are reported back to the power transmission module as reported in the deviation status report and the deviation status report is sent from the power reception module to the power transmission module and the processor on the power transmission module adjusts the power sent from the power transmission module to substantially minimize deviations between the phase variations, amplitude variations and power factor variations between the power origination status report and the power reception status report are reported back to the power transmission module as reported in the deviation status report.

11. The method of claim 10, wherein the power supplied from power transmission module is analyzed for phase variations, amplitude variations and power factor variations and a power origination status report of the power for the power supplied from power transmission module is stored in the computer readable medium and the power origination status report indicates phase variations, amplitude variations and power factor variations.

12. The method of claim 10, the method further comprising:
sensing an open circuit in one of a three phase alternating current power cable set that sends power from a sending electronic box on a first island to a receiving electronic box on a second island, wherein an open circuit on one of the three phase cables is sensed by the first electronic box; and
switching the power from the first island from three phase power to direct current power transmission.

* * * * *